(12) United States Patent
Belotserkovsky

(10) Patent No.: US 7,894,513 B2
(45) Date of Patent: Feb. 22, 2011

(54) SLICING ALGORITHM FOR MULTI-LEVEL MODULATION EQUALIZING SCHEMES

(75) Inventor: Maxim B. Belotserkovsky, Indianapolis, IN (US)

(73) Assignee: Thomson Licensing, Boulogne Billancourt (FR)

( * ) Notice: Subject to any disclaimer, the term of this patent is extended or adjusted under 35 U.S.C. 154(b) by 264 days.

(21) Appl. No.: 10/507,863

(22) PCT Filed: Mar. 3, 2003

(86) PCT No.: PCT/US03/06552

§ 371 (c)(1),
(2), (4) Date: Sep. 16, 2004

(87) PCT Pub. No.: WO03/079751

PCT Pub. Date: Oct. 2, 2003

(65) Prior Publication Data

US 2005/0220220 A1  Oct. 6, 2005

Related U.S. Application Data

(60) Provisional application No. 60/365,588, filed on Mar. 19, 2002.

(51) Int. Cl.
*H03H 7/30* (2006.01)
(52) U.S. Cl. ..................................................... 375/229
(58) Field of Classification Search ................. 375/316, 375/229, 233, 326, 344; 455/232.1, 241.1
See application file for complete search history.

(56) References Cited

U.S. PATENT DOCUMENTS

| 5,081,652 | A | * | 1/1992 | Farahati et al. | 375/344 |
| 5,471,508 | A | * | 11/1995 | Koslov | 375/344 |
| 5,504,453 | A | * | 4/1996 | MacDonald et al. | 329/304 |
| 5,521,942 | A | * | 5/1996 | Betts et al. | 375/295 |
| 5,537,439 | A | * | 7/1996 | Choi | 375/232 |

(Continued)

FOREIGN PATENT DOCUMENTS

GB  2 232 852 A  12/1990

(Continued)

OTHER PUBLICATIONS

Search Report Dated Sep. 4, 2003.

(Continued)

*Primary Examiner*—David C Payne
*Assistant Examiner*—Leon-Viet Q Nguyen
(74) *Attorney, Agent, or Firm*—Robert D. Shedd; Paul P. Kiel

(57) ABSTRACT

A method for slicing a received signal includes the steps of receiving a signal representing one of a constellation of ideal data points in a planar signal space, the received signal being at a point in the signal space, and assigning to the received signal a decision point having a predetermined magnitude and an angle representing a corresponding ideal signal point A slicer includes a source for receiving a signal representing one of a constellation of ideal data points in a planar signal space, the received signal being at a point in the signal space, and circuitry, coupled to the signal source, for generating a signal representing a decision point having a predetermined magnitude and an angle representing an ideal signal point corresponding to the signal point .

20 Claims, 3 Drawing Sheets

U.S. PATENT DOCUMENTS

| | | | | |
|---|---|---|---|---|
| 5,550,596 | A * | 8/1996 | Strolle et al. | 348/607 |
| 5,559,791 | A * | 9/1996 | Bremer et al. | 370/207 |
| 5,712,873 | A * | 1/1998 | Shiue et al. | 375/233 |
| 5,742,643 | A * | 4/1998 | Reeves et al. | 375/243 |
| 5,799,037 | A * | 8/1998 | Strolle et al. | 375/233 |
| 5,822,368 | A * | 10/1998 | Wang | 375/229 |
| 5,828,705 | A * | 10/1998 | Kroeger et al. | 375/326 |
| 5,832,041 | A * | 11/1998 | Hulyalkar | 375/340 |
| 5,838,734 | A * | 11/1998 | Wright | 375/316 |
| 5,963,589 | A * | 10/1999 | Nagano et al. | 375/224 |
| 6,075,816 | A * | 6/2000 | Werner et al. | 375/229 |
| 6,252,912 | B1 * | 6/2001 | Salinger | 375/278 |
| 6,421,379 | B1 * | 7/2002 | Vannatta et al. | 375/229 |
| 6,714,601 | B2 * | 3/2004 | Makinen | 375/316 |
| 6,728,524 | B2 * | 4/2004 | Yamanaka et al. | 455/232.1 |
| 6,744,827 | B1 * | 6/2004 | Vandenabeele et al. | 375/320 |
| 6,856,648 | B1 * | 2/2005 | Hyll | 375/232 |
| 6,959,050 | B2 * | 10/2005 | Baum et al. | 375/326 |
| 7,003,055 | B2 * | 2/2006 | Sexton et al. | 375/341 |
| 7,072,382 | B2 * | 7/2006 | Dent | 375/146 |
| 2002/0054633 | A1 * | 5/2002 | Hessel et al. | 375/229 |
| 2002/0071500 | A1 * | 6/2002 | Kaewell | 375/316 |
| 2003/0035492 | A1 * | 2/2003 | Murphy | 375/295 |
| 2003/0043928 | A1 * | 3/2003 | Ling et al. | 375/267 |
| 2004/0013189 | A1 * | 1/2004 | Jayaraman et al. | 375/233 |

FOREIGN PATENT DOCUMENTS

| | | |
|---|---|---|
| JP | 06-244888 | 2/1994 |
| WO | WO 02/062002 A1 | 8/2002 |

OTHER PUBLICATIONS

European Search Report, Dated Sep. 5, 2005.

* cited by examiner

SLICING ALGORITHM FOR MULTI-LEVEL MODULATION EQUALIZING SCHEMES

This application claims the benefit, under 35 U.S.C. §365 of International Application PCT/US03/06552, filed Mar. 3, 2003, which was published in accordance with PCT Article 21(2) on Oct. 2, 2003 in English and which claims the benefit of U.S. patent application No. 60/365,588, filed Mar. 19, 2002.

FIELD OF THE INVENTION

The present invention relates to slicing algorithms for use in equalization systems, and in particular to slicing algorithms used for multi-level modulation equalizing schemes.

BACKGROUND OF THE INVENTION

FIG. 1 is a block diagram illustrating a known arrangement of a decision-feedback equalizer (DFE). In FIG. 1, an input terminal 5 is coupled to a source (not shown) of a sequence of signals each representing one of a constellation of ideal signal points in a planar signal space. Input terminal 5 is coupled to an input terminal of an FIR filter 10. An output terminal of the FIR filter 10 is coupled to an input terminal of a slicer 30 and to a first input terminal of a subtractor 40. An output terminal of the slicer 30 is coupled to a second input terminal of the subtractor 40 and to an output terminal 15. The output terminal 15 is coupled to a backend of a receiver (not shown) for decoding and utilizing the information encoded in the received signal. An output terminal of the subtractor 40 is coupled to an input terminal of a coefficient control circuit 20. An output terminal of the coefficient control circuit 20 is coupled to a control input terminal of the FIR filter 10.

In known equalizers such as illustrated in FIG. 1, the coefficient control circuit 20 implements a tap coefficient adaptation scheme, such as Least Mean Squares (LMS), to adjust the tap coefficients in the FIR filter 10. The subtractor 40 calculates an error signal E, which is the difference between the equalized received input signal from the FIR filter 10, representing a transmitted data symbol, and a sliced ideal signal from the slicer 30, representing the data symbol which is assumed to have been transmitted. In response to the error signal E, the coefficient control circuit 20 computes modified coefficient values for the FIR filter 10 taps to bring the equalized data signal closer to the ideal signal, hence achieving correct equalizer adaptation or convergence, all in a known manner.

Because in most cases the transmitted data is not known at the receiving end, the symbol assumed to have been transmitted must be estimated from the equalized data itself. A common way to provide such an estimation is called 'slicing', in which the decision of which symbol is assumed to have been transmitted is based on a plurality of pre-defined regions in the signal space, called 'decision regions'. The decision region within which the received equalized signal lies determines the assumed transmitted symbol. Slicing works well when the large majority of the received equalized signals are in the correct decision regions and the slicing errors that do occur, happen in a random fashion such that they do not favor any of the regions neighboring the correct one. In this situation the average equalizer taps will converge.

A problem arises when signal impairments, such as residual carrier frequency and/or phase offset, cause slicing errors which favor one or more of the neighboring decision regions over others, i.e. the equalized data is consistently wrong in the long run. Such impairments potentially cause the equalizer taps to be driven towards incorrect steady-state values. In QAM modulation schemes this phenomenon can manifest itself in a form of a magnitude false-lock, where the tap magnitude of the equalizer taps is driven towards an incorrect steady-state average value.

FIG. 2 is a signal space diagram illustrating ideal and equalized received constellations useful in understanding the operation of the present invention. FIG. 2 illustrates a 16 QAM signal ideal constellation as filled in circles and equalized received signal points as hollow circles. Standard known decision regions are delimited by dotted lines. One skilled in the art will understand that these decision regions are rectangular regions disposed symmetrically around the ideal constellation points. Referring to FIG. 2a, the constellation of equalized received points (hollow circles) is smaller in magnitude than the constellation of ideal points, e.g. due to the presence of noise. In addition, the presence of a carrier phase and/or frequency offset causes the constellation of equalized received points to be rotated counterclockwise in the signal space.

More specifically, the equalized received point 5' represents a transmitted symbol corresponding to that represented by the ideal point 5 in decision region d5. However, as described above, point 5' is rotated counter-clockwise and is reduced in amplitude so that is lies in the decision region d1. Consequently, the slicer 30 when receiving a signal at point 5' will make the incorrect decision that the symbol represented by ideal point 1 was transmitted. In addition, the difference between received point 5' and ideal point 1 indicates that the magnitude of the received constellation is too large, and that the angle is correct. In response, the equalizer FIR filter 10 taps will be updated by the coefficient control circuit 20 to make the received constellation smaller.

It is conceivable, then, that if the right sequence of symbols occurs, the equalizer taps will be updated so that the equalized received constellation becomes so small that it becomes a 'miniature' version of the correct constellation that fits entirely inside the 4 innermost decision regions, as is illustrated in FIG. 2b. This is a stable false-lock situation, because this 'mini'-constellation will always be sliced to the inner points 1-4 and hence its average power will be driven to correspond to a constant modulus ring passing through the inner points.

One known way to adapt the equalizer taps when correct slicer decisions cannot be made is called Constant Modulus Algorithm (CMA). The decisions made by the CMA algorithm do not coincide with ideal symbol signal locations. Instead, the CMA algorithm updates the tap coefficients in a manner which drives the average magnitude of the equalized received data toward the precalculated average magnitude of the ideal transmitted constellation, a magnitude value called the CMA ring radius. This method, however, is fairly crude and may converge towards a steady state with a residual rotational bias of the equalized constellation, thus resulting in overall decreased performance.

In some frequency-domain modulation schemes, such as the one used in Hiperlan2/IEE802.11a standards, the assumption of the frequency domain continuity between the adjacent equalizer taps is used to prevent a given equalizer tap value from being given a value which is too different from its neighbors. This method, however, is expensive to implement and its performance is highly dependent on the actual transmission channel frequency response.

A slicing algorithm which is simple and inexpensive to implement and which would, at the same time, combine the rotational invariance of the CMA with the unbiased steady-state constellation placement of the decision-directed methods is desirable.

BRIEF SUMMARY OF THE INVENTION

In accordance with principles of the present invention, a method for slicing a received signal includes the steps of receiving a signal representing one of a constellation of ideal data points in a planar signal space, the received signal being at a point in the signal space, and assigning to the received signal a decision point having a predetermined magnitude and an angle representing a corresponding ideal signal point. A slicer includes a source for receiving a signal representing one of a constellation of ideal data points in a planar signal space, the received signal being at a point in the signal space, and circuitry, coupled to the signal source, for generating a signal representing a decision point having a predetermined magnitude and an angle representing an ideal signal point corresponding to the received signal point.

The key point of this algorithm is preventing a magnitude false lock by making sure that the average constellation power remains correct regardless of what decision area the received signal point may erroneously slice into. A slicer according to principles of the present invention uses the basic premise behind the CMA. That is, the magnitudes of the sliced values are changed so that the new points lie on a CMA ring. However, the slicer also preserves the correct angles of the sliced values, thus making sure the equalizer taps phases are driven towards correct values.

The slicing algorithm according to principles of the present invention may be used in a decision-feedback equalizer (DFE) for multilevel modulation schemes, such as Quadrature Amplitude Modulation (QAM). The algorithm provides improved estimation of transmitted data to facilitate correct equalizer adaptation in the presence of impairments, such as carrier rotation.

DETAILED DESCRIPTION OF THE INVENTION

Figure 1:
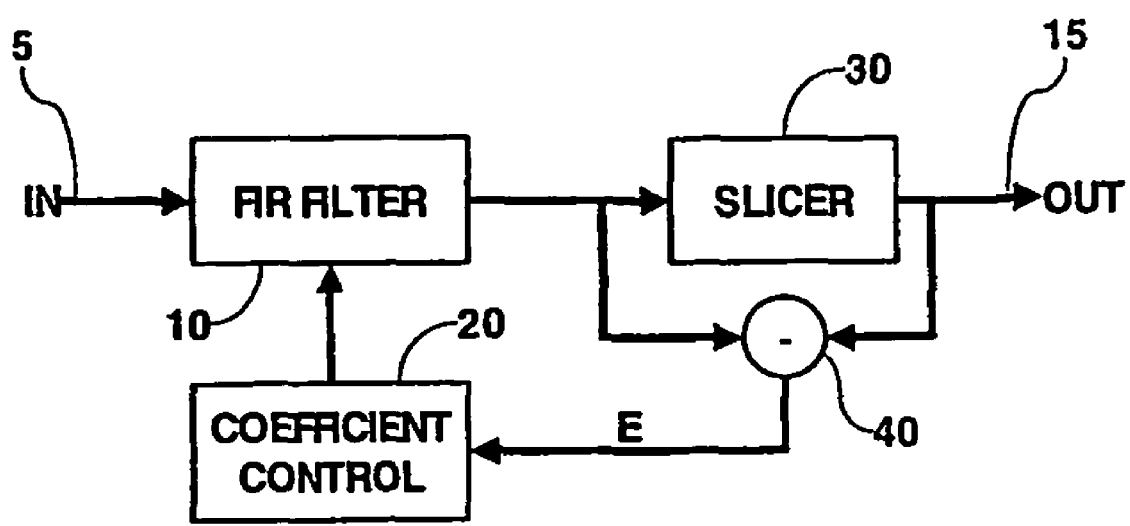
FIG. 1 is a block diagram illustrating a known arrangement of a DFE equalizer.
Figure 2:
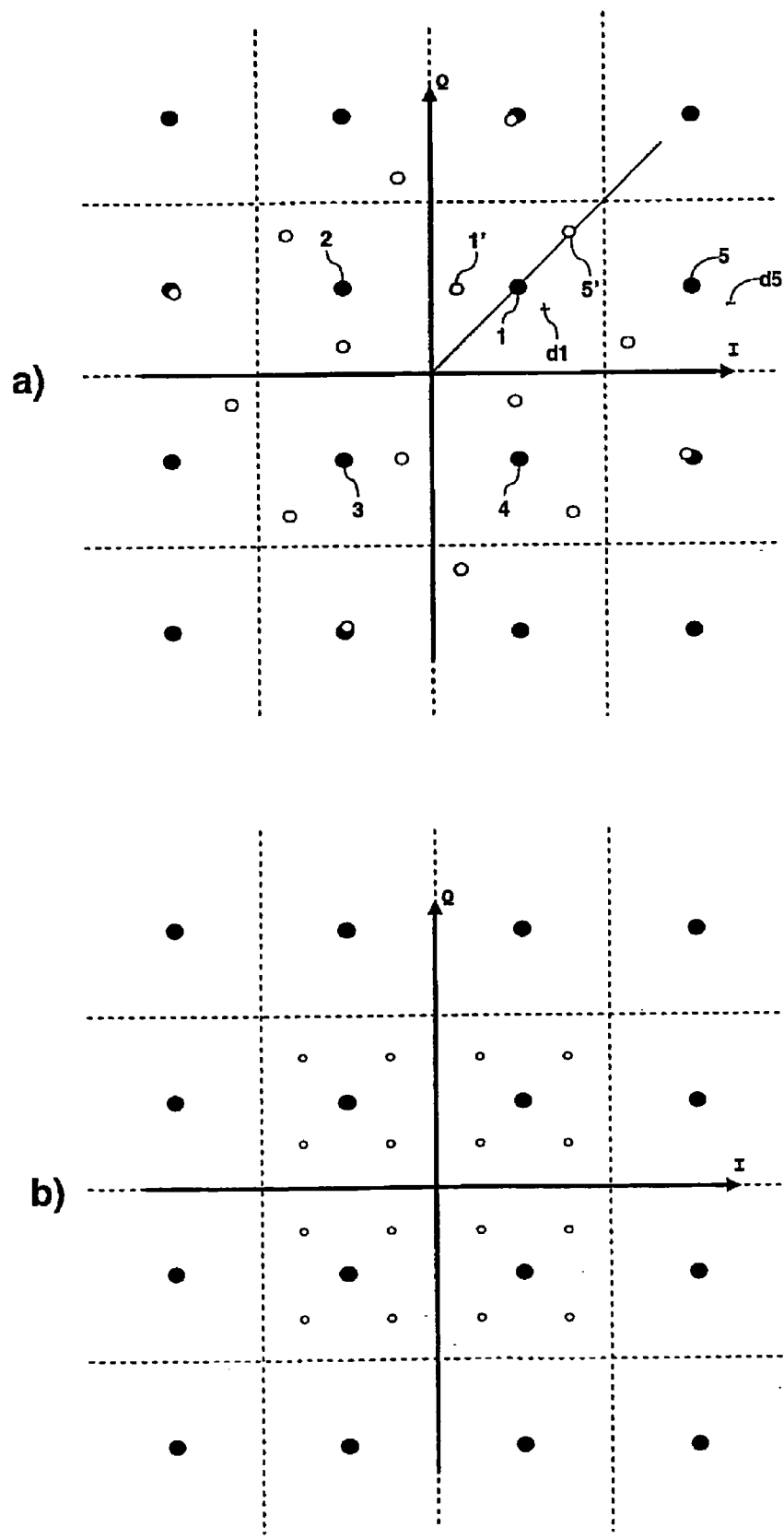
FIG. 2 is a signal space diagram illustrating ideal and received constellations useful in understanding the operation of the present invention.

FIG. 3a and FIG. 3b are signal space diagrams illustrating slicer decision regions and decision points useful in describing and understanding the operation of a slicer 30 (of FIG. 1) implementing principles of the present invention. Elements which are the same as those illustrated in FIG. 2 are designated by the same reference numbers. As in FIG. 2, FIG. 3a and FIG. 3b illustrate a 16 QAM signal ideal constellation as filled in circles and boundaries between decision regions as dotted lines. FIG. 3a and FIG. 3b further illustrate slicer decision points as circled dots. FIG. 3a and FIG. 3b illustrate the difference between the traditional slicer decision points (1-9, ... ) and those in accordance with principles of the present invention (21-29, ... ).

In general, all the slicer decision points 21-29, ... according to the present invention have the same predetermined magnitude |A|. This predetermined magnitude |A| is the magnitude of average power of the ideal constellation, i.e. the CMA ring 20 magnitude. The angles of the respective decision points 21-29, ... are equal to the angles of corresponding ideal constellation points 1-9, .... In FIG. 3a, the decision regions are defined as circular sectors, that is, angular ranges, around the angles of the respective decision points. In FIG. 3b, the decision regions are defined as rectangular areas surrounding the ideal constellation points, as in traditional slicers.

Referring to FIG. 3a, the ideal constellation point 5 lies at the angle α=Arctan(⅓)=18.4° from the I axis. The slicer decision point 25, corresponding to ideal constellation point 5, lies on the CMA ring 20 at an angle α=18.4°. The ideal constellation points 1 and 6 lie at the angle 45° from the I axis. The slicer decision point 21,26, corresponding to both ideal constellation points 1 and 6, lies on the CMA ring 20 at the angle 45°. The ideal constellation point 7 lies at an angle β=Arctan(3)=71.6° from the I axis. The slicer decision point 27, corresponding to ideal constellation point 7, lies on the CMA ring 20 at an angle β=71.6°.

A decision region d5, therefore, may be defined as the circular sector between the I axis, 0°, and the bisector between 18.4° and 45°, or 31.7°, illustrated by dotted line 32. A decision region d7 may be defined as the circular sector between the Q axis, 90°, and the bisector between 71.6° and 45° or 58.3°, illustrated by dotted line 34. Finally, a decision region d1,6 may be defined as the circular sector between 31.7° and 58.3°.

The arrangement of quadrant I has been described above. However, one skilled in the art will understand that the other three quadrants (II, III, IV) have similar geometries, and the decision regions may be determined using the same process described above for the quadrant I. One skilled in the art will also understand that the boundaries between decision regions may be adjusted to angular locations other than bisectors between the angles of the ideal constellation points for any desired reason. For example, equiangular decision regions may be defined with boundaries every 30° starting from the I axis (i.e. 30°, 60°, 90°, ... ) for computational simplicity.

Every equalized received signal point in the signal space illustrated in FIG. 3a is assigned a slicer decision point (21-29, ... ) according to which decision region (d1,6, d5, d7, ... ) that received signal point is in. These slicer decision points (21-29, ... ) preserve the correct angles of the ideal constellation points while changing their respective magnitudes to the same value, equal to the radius of the CMA ring 20. The difference between the equalized received signal point and the assigned slicer decision point is then used to adjust the equalized tap coefficients, in the known manner.

For example, received signal point 42 lies at an angle θ within decision region d7, and, therefore, is assigned slicer decision point 27. The difference between the received signal point 42 and the slicer decision point 27 indicates that the magnitude of the received constellation needs to be increased, and that the angle of the received constellation needs to be rotated clockwise. The equalized tap coefficients are then adjusted appropriately, in a known manner, to increase the magnitude of the received constellation and to rotate that constellation clockwise.

Because the CMA ring 20 is at the magnitude |A| representing the average power of the ideal constellation, the magnitude of the equalized received constellation will be adjusted to the same average power of the ideal constellation over the long run, avoiding the false-lock condition described above.

Similarly, the rotation of the equalized received constellation will be adjusted to the proper angular orientation over the long run.

Figure 3:
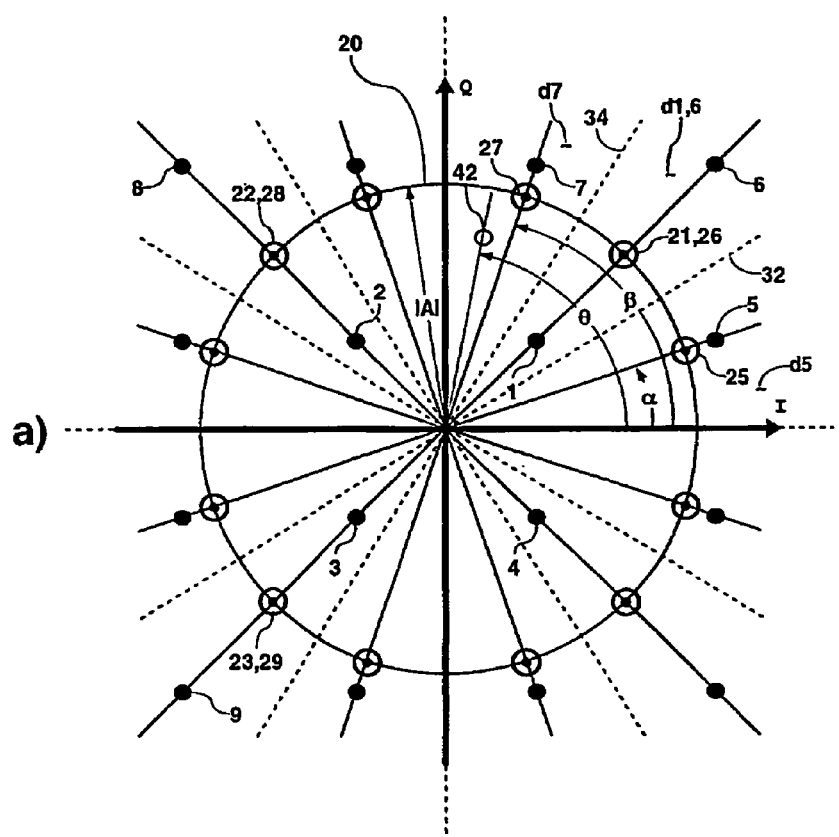
FIG. 3 is a signal space diagram illustrating the ideal constellation and slicer decision points useful in describing and understanding the operation of a slicer implementing principles of the present invention.
Figure 3:
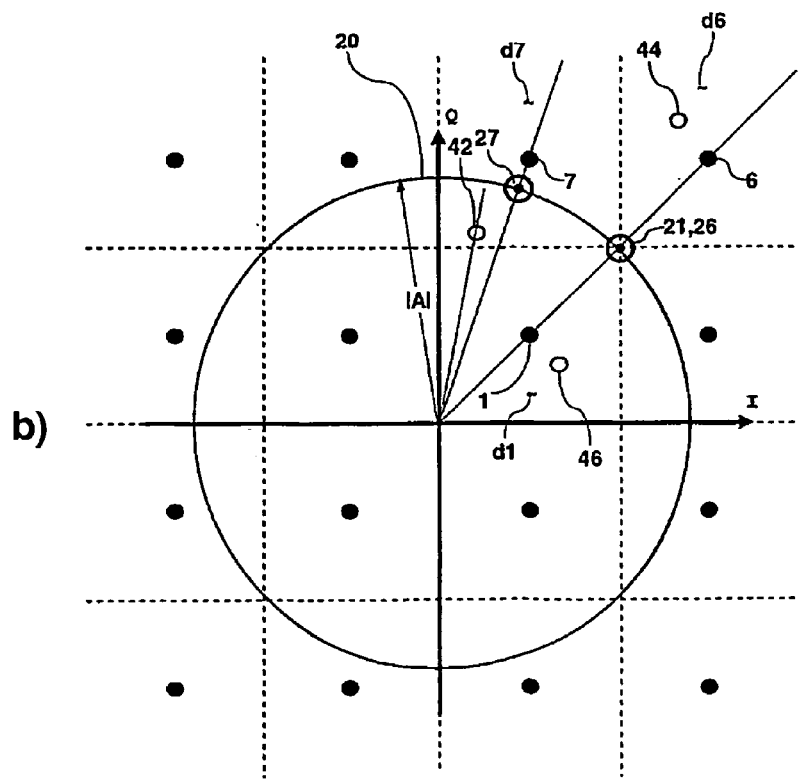

One skilled in the art of digital receiver design will readily be able to design and implement a slicer 30 which can operate as illustrated in FIG. 3. In one embodiment, the slicer 30 (of FIG. 1) may include circuitry which will determine the angle θ of every equalized received signal point, which is readily calculable as θ=Arctan($S_Q/S_I$) where $S_I$ is the in-phase or I component of the signal point 42 and $S_Q$ is the quadrature or Q component of the signal point. The calculated angle θ of the signal point is compared to the angles of the boundaries (I axis, 32, 34, Q axis, . . . ) between the decision regions, determined as described above, to determine in which decision region the signal point lies. The sliced decision point corresponding to the determined decision region is then produced as the sliced value for the received signal point. The difference between this sliced decision point and the received signal point may then be used to condition the coefficient controller 20 to adjust the tap coefficients of the equalizer 10, in the well known manner.

This circuitry may be implemented in the digital or analog domain, or as a combination of both. This circuitry may also be specially designed hardware dedicated to perform these functions or may include a processor operating under the control of a control program which conditions the processor to perform the above process, or a combination of both.

In an alternate, and preferred, implementation, the slicer 30 (of FIG. 1) may be implemented by a look-up table receiving a signal representing the received signal point at an input terminal and producing a signal representing the decision point corresponding to that received signal point at an output terminal. The memory locations in the look-up table are partitioned such that input signals representing signal points in a decision region (d1,6, d5, d7, . . . ) address respective locations all containing data which will produce an output signal representing the decision point (21,26, 25, 27, . . . ) corresponding to that decision region, all in a known manner.

FIG. 3b illustrates an alternate embodiment of a slicer 30 (of FIG. 1) according to the present invention. In the embodiment illustrated in FIG. 3b, the decision regions (d1, d6, d7, . . . ) are formed as rectangular areas around corresponding ideal constellation points (1, 6, 7, . . . ), as in the traditional slicer illustrated in FIG. 2. However, instead of the slicer 30 producing a signal representing the ideal constellation point at the center of each decision region, the decision points illustrated in FIG. 3a are produced. That is, the decision point corresponding to each decision region has the predetermined magnitude |A| of the CMA ring 20, and the angle of the ideal constellation point within that decision region.

For example, received signal point 42 in FIG. 3b lies in decision region d7 containing ideal constellation point 7. Thus, the decision point 27, corresponding to decision region d7, is produced for the received signal point 42. Similarly, received signal point 44 lies in decision region d6. The decision point 21,26 is produced for the received signal point 44. Received signal point 46 lies in decision region d1. The decision point 21,26 is also produced for the received signal point 46. This simple modification of the contents of the look-up table means that no further circuitry is required over that provided by the traditional slicers to implement a slicer according to the present invention.

As with FIG. 3a, because the CMA ring 20 is at the predetermined magnitude |A| representing the average power of the ideal constellation, the magnitude of the equalized received constellation will be adjusted to the same average power of the ideal constellation over the long run, avoiding the false-lock condition described above. Similarly, the rotation of the equalized received constellation will be adjusted to the proper angular orientation over the long run.

For the embodiment illustrated in FIG. 3b, the look-up table in traditional slicers is modified to produce the decision points 21-29, . . . instead of the ideal constellation points 1-9, . . . for signals in the respective decision regions d1, d6, d7, . . . . More specifically, in the traditional slicer, for all received signal points in decision region d1, the look-up table produces the ideal constellation value 1. In a slicer with a look-up table modified according to the present invention, as illustrated in FIG. 3b, for all received signal points in decision region d1, the look-up table produces the decision point 21,26. The same is true for all received signals in decision region d6. For all received signal points in decision region d7, the look-up table produces the decision point 27, and so forth. One skilled in the art will understand how to reprogram the look-up table to produce new decision points for each decision region as illustrated in FIG. 3b. This simple modification of the contents of the look-up table means that no further circuitry is required over that provided by the traditional slicers to implement a slicer according to the present invention.

The slicer described above is especially useful in the case of IEE802.11a and Hiperlan2 standards, where signal impairments in the transmissions may occur in bursts and each of the received frequency-domain sub-carriers can rotate independently. A good initial equalizer tap setting may be obtained using training symbols, i.e. the transmitted symbol for each received signal is known at the receiver, but the residual rotation of the sub-carriers may cause the first few symbols to be equalized into wrong decision regions before the residual rotation can be removed jointly by the equalizer and the carrier synchronization circuitry, as illustrated in FIG. 2. By the time such rotation has been removed, the equalizer may have already false-locked as described above. The slicing algorithm according to the present invention will eliminate this unwanted effect.

The invention claimed is:

1. A method for slicing a received signal in a slicer, comprising the steps of:

receiving a signal to be sliced in an input of said slicer;

identifying, by said slicer, an ideal signal point in a constellation of ideal signal points in a planar signal space wherein the constellation of ideal signal points includes a plurality of decision regions, each decision region having a plurality of ideal signal points distributed throughout, the identified ideal signal point being located closer to the received signal than other ideal signal points in the constellation of ideal signal points;

determining, in circuitry coupled to the slicer input, an angle of the identified ideal signal point with respect to an origin;

determining, in said circuitry, an average power of all of the plurality of ideal signal points in the constellation of ideal signal points;

generating, in said circuitry, a signal representing a decision point having a predetermined magnitude equal to a magnitude of the average power of all of the plurality of ideal signal points in the constellation of ideal signal points and an angle equal to the determined angle; and assigning the decision point associated with the determined decision region to the received signal;

wherein said decision regions are defined as respective regions between adjacent boundary angles, said boundary angles adjusted to be bisectors between adjacent angles representing respective points in the constellation of ideal signal points.

2. The method of claim 1 wherein the generating step comprises steps of:
defining decision regions comprising respective neighborhoods around associated decision points;
determining the decision region in which the received signal point lies.

3. The method of claim 2 wherein the step of defining decision regions comprises steps of:
defining neighborhoods around identified ideal signal points as respective decision regions; and associating the decision point with each decision region.

4. The method of claim 3 wherein the step of defining neighborhoods comprises a step of defining rectangular regions around the identified ideal signal point.

5. The method of claim 3 wherein the step of defining neighborhoods comprises a step of defining circular sectors containing the identified ideal signal point.

6. The method of claim 3 wherein the step of associating a decision point with each decision region comprises a step of associating a decision region with the decision point having the predetermined magnitude and the angle of the ideal signal point corresponding to the decision region.

7. The method of claim 2 wherein the step of defining decision regions comprises steps of:
determining angles representing respective points in the constellation of ideal signal points specifying angles of boundaries between the angles representing the respective points in the constellation of ideal signal points.

8. The method of claim 5 wherein the step of determining the decision region in which the received signal point lies comprises steps of:
determining the angle of the received signal point; and
determining the decision region containing the angle of the received signal point.

9. The method of claim 8 wherein the angle of the received signal point is calculated as Arctan $(S_q/S_i)$ wherein $S_i$ is the component of the received signal point on the in-phase axis and $S_q$ is the component of the received signal point on the quadrature axis.

10. A slicer, comprising:
a source for receiving a signal to be sliced; where an ideal signal point in a constellation of ideal signal points in a planar signal space is identified, the received signal being at a point in the signal space, wherein the constellation of ideal signal points include a plurality of decision regions, each decision region having a plurality of ideal signal points distributed throughout, the identified ideal signal point being located closer to the received signal than other ideal signal points in the constellation of ideal signal points; and
circuitry, coupled to the signal source for determining an angle of the identified ideal signal point with respect to an origin, determining an average power of all the plurality of ideal signal points in the constellation of ideal signal points, generating boundary representative signals representing angles between respective angles of the constellation of ideal signal points, and generating a signal representing a decision point having a predetermined magnitude equal to a magnitude of the average power of all of the plurality of ideal signal points in the constellation of ideal signal points and an angle equal to the determined angle.

11. The slicer of claim 10 wherein the circuitry comprises circuitry for generating the decision point representative signal having a magnitude equal to the magnitude of the average energy of the constellation of ideal signal points.

12. The slicer of claim 10 wherein the circuitry comprises a look-up table having an input responsive to the received signal and an output representing the decision point representative signal.

13. The slicer of claim 12 wherein the look-up table is partitioned such that input signals representing points in the decision region produce the decision point representative output signal having the value of the decision point corresponding to the received signal point.

14. The slicer of claim 13 wherein decision regions are neighborhoods around respective ideal signal points in the constellation.

15. The slicer of claim 14 wherein decision regions are circular sectors containing respective ideal signal points in the constellation.

16. The slicer of claim 14 wherein decision regions are rectangular regions around respective ideal signal points in the constellation.

17. The slicer of claim 10 wherein the circuitry comprises:
circuitry for generating respective signals representing the locations of boundaries of decision regions being neighborhoods around associated decision points;
circuitry for generating a signal representing the location of the received signal point;
circuitry for comparing the signal representing the location of the received signal point to the signals representing the locations of decision region boundaries; and
circuitry for generating a signal representing the decision point associated with the decision region containing the received signal point.

18. The slicer of claim 17 wherein:
the circuitry for generating boundary representative signals generates respective signals representing angles of boundaries;
the circuitry for generating the received signal location representative signal comprises circuitry for generating a signal representing the angle of the received signal; and
the comparing circuitry compares the signal representing the angle of the received signal to the respective signals representing the angles of the boundaries.

19. The slicer of claim 18 wherein:
the received signal source generates a signal $S_i$ representing the in-phase component of the received signal and a signal $S_q$ representing the quadrature component of the received signal; and
the circuitry for generating the received signal location angle representative signal generates a signal equal to Arctan $(S_q/S_i)$.

20. The slicer of claim 18 wherein the circuitry for generating boundary representative signals generates signals representing bisectors of the respective angles of the constellation of ideal signal points.

* * * * *